(12) United States Patent
Xiao et al.

(10) Patent No.: US 7,773,004 B2
(45) Date of Patent: Aug. 10, 2010

(54) CAVLC RUN-BEFORE DECODING SCHEME

(75) Inventors: Shu Xiao, San Diego, CA (US); Ka-Shu Ko, San Ramon, CA (US); Yiliang Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 13 days.

(21) Appl. No.: 12/169,464

(22) Filed: Jul. 8, 2008

(65) Prior Publication Data

US 2010/0007533 A1 Jan. 14, 2010

(51) Int. Cl.
*H03M 7/40* (2006.01)
(52) U.S. Cl. .......................... 341/67; 341/50
(58) Field of Classification Search ............. 341/55–90
See application file for complete search history.

(56) References Cited

U.S. PATENT DOCUMENTS

| | | | |
|---|---|---|---|
| 6,646,578 B1 * | 11/2003 | Au | 341/67 |
| 7,135,997 B2 * | 11/2006 | Oh | 341/106 |
| 7,161,509 B2 * | 1/2007 | Naito | 341/67 |
| 7,245,242 B2 * | 7/2007 | Hu et al. | 341/107 |
| 7,385,535 B2 * | 6/2008 | Yang et al. | 341/107 |
| 7,423,562 B2 * | 9/2008 | Kim et al. | 341/67 |
| 7,460,042 B2 * | 12/2008 | Oshikiri et al. | 341/107 |
| 7,495,588 B2 * | 2/2009 | Otsuka | 341/107 |
| 7,528,749 B2 * | 5/2009 | Otsuka | 341/107 |
| 7,573,405 B2 * | 8/2009 | Shima | 341/51 |
| 7,573,406 B2 * | 8/2009 | Hellman | 341/67 |

\* cited by examiner

*Primary Examiner*—Lam T Mai
(74) *Attorney, Agent, or Firm*—John Rickenbrode

(57) ABSTRACT

Techniques for decoding the run_before fields in a CAVLC encoded bitstream for H.264 are disclosed. In one aspect, the codewords corresponding to a plurality of consecutive initial zero-value run_before codewords are stored in a look-up table, allowing the decoding of such a plurality of run_before codewords in a single computation cycle. In another aspect, the look-up table is additionally configured to decode the next non-zero run_before value after the initial zero-value run_before codewords in the same computation cycle.

33 Claims, 10 Drawing Sheets

RESIDUAL BLOCK OF
TRANSFORM
COEFFICIENTS

RESULTING
COEFFICIENT SCAN 0, 1, 2, 3, 4, 5

6, 7, 8, 9, 10

11, 12, 13, 14, 15

CAVLC ZIG-ZAG SCAN

| run_before | zerosLeft | | | | | | |
|---|---|---|---|---|---|---|---|
| | 1 | 2 | 3 | 4 | 5 | 6 | >6 |
| 0 | 1 | 1 | 11 | 11 | 11 | 11 | 111 |
| 1 | 0 | 01 | 10 | 10 | 10 | 000 | 110 |
| 2 | - | 00 | 01 | 01 | 011 | 001 | 101 |
| 3 | - | - | 00 | 001 | 010 | 011 | 100 |
| 4 | - | - | - | 000 | 001 | 010 | 011 |
| 5 | - | - | - | - | 000 | 101 | 010 |
| 6 | - | - | - | - | - | 100 | 001 |
| 7 | - | - | - | - | - | - | 0001 |
| 8 | | - | - | - | - | - | 00001 |
| 9 | - | - | - | - | - | - | 000001 |
| 10 | - | - | - | - | - | - | 0000001 |
| 11 | - | - | - | - | - | - | 00000001 |
| 12 | - | - | - | - | - | - | 000000001 |
| 13 | - | - | - | - | - | - | 0000000001 |
| 14 | - | - | - | - | - | - | 00000000001 |

FIG 4

| LUT1 for ZerosLeft = 1 and Block Size = 16 |||
|---|---|---|
| INPUT:<br>Bitstream | OUTPUT:<br># of zero-value run_before<br>codewords | OUTPUT:<br>Next run_before ==1? |
| ["1" x 14] | 14 | -- |
| ["1" x 13, "0"] | 13 | YES |
| ⋮ | ⋮ | ⋮ |
| ["1" x 2, "0"] | 2 | YES |
| ["1" x 1, "0"] | 1 | YES |
| Else | 0 | -- |

FIG 7A

| LUT1 for ZerosLeft = 2 and Block Size = 16 |||
|---|---|---|
| INPUT:<br>Bitstream | OUTPUT:<br># of zero-value<br>run_before<br>codewords | OUTPUT:<br>Next run_before ==1? |
| ["1" x 14] | 14 | -- |
| ["1" x 13, "01"] | 13 | YES |
| ["1" x 13, "00"] | 13 | NO |
| ⋮ | ⋮ | ⋮ |
| ["1" x 2, "01"] | 2 | YES |
| ["1" x 2, "00"] | 2 | NO |
| ["1" x 1, "01"] | 1 | YES |
| ["1" x 1, "00"] | 1 | NO |
| Else | 0 | -- |

FIG 7B

| | LUT1 for ZerosLeft = 3 and Block Size = 16 | |
|---|---|---|
| INPUT:<br>Bitstream | OUTPUT:<br># of zero-value<br>run_before<br>codewords | OUTPUT:<br>Next run_before ==1? |
| ["11" x 12] | 12 | - - |
| ["11" x 11, "10"] | 11 | YES |
| ["11" x 11, "0"] | 11 | NO |
| ⋮ | ⋮ | ⋮ |
| ["11" x 2, "10"] | 2 | YES |
| ["11" x 2, "0"] | 2 | NO |
| ["11" x 1, "10"] | 1 | YES |
| ["11" x 1, "0"] | 1 | NO |
| Else | 0 | - - |

FIG 7C

LUT1.STRING for ZerosLeft = 2 and Block Size = 16

| INPUT:<br>Bitstream | OUTPUT:<br># of zero-value<br>run_before<br>codewords |
|---|---|
| ["1" x 14] | 14 |
| ["1" x 13, not "1"] | 13 |
| ["1" x 12, not "1"] | 12 |
| ⋮ | ⋮ |
| ["1" x 2, not "1"] | 2 |
| ["1" x 1, not "1"] | 1 |
| [not "1"] | 0 |

FIG 8A

LUT1.LKAHEAD for ZerosLeft = 2 and Block Size = 16

| INPUT:<br>Bitstream | OUTPUT:<br>Next run_before<br>codeword ==1? |
|---|---|
| ["1" x 13, "01"] | YES |
| ["1" x 12, "01"] | YES |
| ⋮ | ⋮ |
| ["1" x 2, "01"] | YES |
| ["1" x 1, "01"] | YES |
| Else | NO |

FIG 8B

| LUT2 for ZerosLeft = 1 |

| INPUT: Bitstream | OUTPUT: Decoded run_before codeword |
|---|---|
| ["1" - - - ] | 0 |
| ["0" - - - ] | 1 |

FIG 9A

| LUT2 for ZerosLeft = 2 |

| INPUT: Bitstream | OUTPUT: Decoded run_before codeword |
|---|---|
| ["01" - - - ] | 1 |
| ["00" - - - ] | 2 |
| Else | - - |

FIG 9B

| LUT2 for ZerosLeft = 3 |

| INPUT: Bitstream | OUTPUT: Decoded run_before codeword |
|---|---|
| ["10" - - - ] | 1 |
| ["01" - - - ] | 2 |
| ["00" - - - ] | 3 |
| Else | - - |

CAVLC RUN-BEFORE DECODING SCHEME

TECHNICAL FIELD

The disclosure relates to decoding techniques for video frames, and more particularly, to decoding techniques for CAVLC encoded signals employing run-before encoding.

BACKGROUND

H.264 is a standard for digital video. See ITU-T Rec. H.264, March 2005, hereinafter "the H.264 specification," hereby incorporated by reference in its entirety. Designed for the delivery of high quality video at low bitrates, H.264 employs a number of advanced video encoding features, such as motion compensation, intra-frame directional spatial predictive coding, and entropy coding. Entropy coding is a technique for bitrate reduction that exploits the statistical redundancies expected to be present in the video to be encoded. The H.264 specification specifies two types of entropy coding: context adaptive variable length coding (CAVLC), and context adaptive binary arithmetic coding (CABAC). CAVLC is described in Section 9.2 of the H.264 specification.

One aspect of CAVLC calls for successively encoding the number of zeros separating each non-zero coefficient from the previous non-zero coefficient in a scan, i.e., the "run_before" values according to the H.264 specification. To recover the original scan, a typical CAVLC decoder may expend at least one computation cycle to decode each encoded run_before value. In some cases, such decoding may be inefficient, e.g., when the original scan includes a long string of consecutive non-zero coefficients, each having a corresponding run_before value of zero.

It would be desirable to provide techniques to more efficiently decode the run_before values in CAVLC encoded signals.

SUMMARY

An aspect of the present disclosure provides a method for decoding at least one run_before codeword in an encoded bitstream of a current coefficient scan. The method includes identifying a bit sequence in the encoded bitstream corresponding to a number of consecutive zero-value run_before codewords, checking a termination condition of the encoded bitstream, and based on the identified bit sequence and the checking of the termination condition, identifying a number of consecutive zero-value run_before codewords corresponding to the current coefficient scan.

Another aspect of the present disclosure provides an apparatus for decoding at least one run_before codeword in an encoded bitstream of a current coefficient scan. The apparatus includes a bit sequence identifier for identifying a sequence of bits in the encoded bitstream corresponding to a number of consecutive zero-value run_before codewords, a termination condition checker for checking a termination condition of the encoded bitstream, and a run_before decoder for identifying a number of consecutive zero-value run_before codewords corresponding to the current coefficient scan based on the identified bit sequence and the checked termination condition.

Yet another aspect of the present disclosure provides an apparatus for decoding at least one run_before codeword in an encoded bitstream of a current coefficient scan. The method includes means for identifying a bit sequence in the encoded bitstream corresponding to a number of consecutive zero-value run_before codewords, means for checking a termination condition of the encoded bitstream, and means for, based on the identified bit sequence and the checking of the termination condition, identifying a number of consecutive zero-value run_before codewords corresponding to the current coefficient scan.

Yet another aspect of the present disclosure provides a computer program product for decoding at least one run_before codeword in an encoded bitstream of a current coefficient scan. The product includes computer-readable medium including code for causing a computer to identify a bit sequence in the encoded bitstream corresponding to a number of consecutive zero-value run_before codewords, code for causing a computer to check a termination condition of the encoded bitstream, and code for causing a computer to, based on the identified bit sequence and the checking of the termination condition, identify a number of consecutive zero-value run_before codewords corresponding to the current coefficient scan.

BRIEF DESCRIPTION OF DRAWINGS

FIG. 4 depicts the codewords for encoding run_before values adopted in H.264 CAVLC.

FIGS. 7A-7C depict an embodiment of a look-up table, LUT1, for implementing the operations described with reference to step 610 in FIG. 6.

FIGS. 8A-8B depict an alternative embodiment for achieving the same functionality as provided by LUT1 in FIG. 7B.

FIGS. 9A-9C depict an embodiment of a look-up table, LUT2, for implementing the operations described with reference to step 612 in FIG. 6.

DETAILED DESCRIPTION

According to the present disclosure, techniques are provided for limiting the maximum number of cycles required to decode a CAVLC encoded scan employing run_before encoding.

Figure 1:
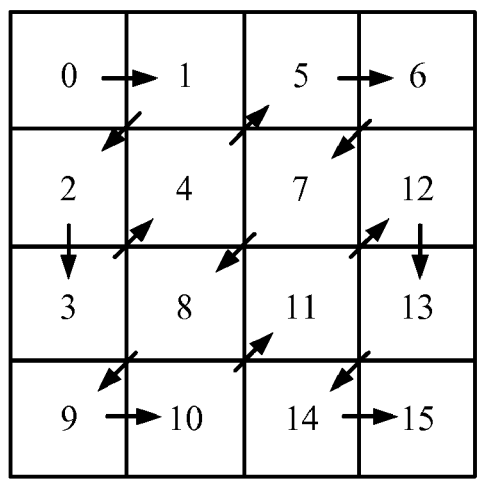
FIG. 1 depicts the scanning of a residual block of transform coefficients (or "coefficients") in zig-zag order to produce a coefficient scan (or "scan"), according to Figure 8-8 of the H.264 specification.
Figure 1:
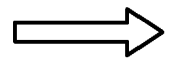

FIG. 1 depicts a method of scanning a residual block of 16 transform coefficients (or "coefficients"). See Figure 8-8 of the H.264 specification. In FIG. 1, coefficients are scanned in zig-zag fashion in the order shown to produce a coefficient scan (or a "scan") for CAVLC encoding.

One of ordinary skill in the art will note that the H.264 specification supports encoding of block sizes other than that shown, e.g., block sizes of 4 or 15 coefficients. The techniques of the present disclosure may readily be applied to decode any block size supported by the H.264 specification. Note also that the scanning order depicted in FIG. 1 is shown for illustration purposes only. One of ordinary skill in the art will realize that the techniques disclosed herein may be readily applied to other methods of scanning transform coefficients.

Note in this specification and in the claims, unless otherwise noted, ordinal references to the transform coefficients (such as the "first" and "last" coefficients, or coefficients at the "beginning" or "end" of a scan, or coefficients positioned "before" or "after" one another) will refer to the position of the coefficients in the order of the scan. For example, the "first" coefficient in the scan of FIG. 1 is labeled "0," while the "last" coefficient is labeled "15." Furthermore, coefficient 0 is positioned "before" coefficient 15, and coefficient 0 is positioned at the "beginning" of the scan, while coefficient 15 is positioned at the "end" of the scan.

From a coefficient scan, the following parameters are defined for CAVLC encoding:

1) TotalCoeffs: the total number of non-zero coefficients in the scan;
2) TrailingOnes: the total number (up to three) of consecutive non-zero coefficients having an absolute value equal to 1 at the end of a coefficient scan;
3) coeff_token: a codeword selected based on TotalCoeffs and TrailingOnes;
4) trailing_ones_sign_flag: the sign (positive or negative) of each of the coefficients counted in TrailingOnes, starting with the sign of the last coefficient counted in TrailingOnes;
5) Level: the level of any non-zero coefficients not counted in TrailingOnes, starting at the end of the scan proceeding towards the beginning of the scan (in H.264, this variable may be composed of two parts level_prefix and level_suffix—for convenience, these parts will be collectively referred to herein as a single variable Level);
6) total_zeros: the total number of zero-level coefficients that are located before the last non-zero coefficient;
7) run_before: the number of consecutive zero-level coefficients in the scan immediately before a given non-zero coefficient, starting from the last non-zero coefficient, proceeding to the second non-zero coefficient; and
8) zerosLeft: the total number of zero-level coefficients in the scan before a given non-zero coefficient. zerosLeft is a non-encoded parameter that may be locally kept track of at both the encoder and the decoder.

One of ordinary skill in the art will realize that the relevant codewords used for encoding the parameters defined above may be found in the H.264 specification. Note that since multiple parameters (such as trailing_ones_sign_flag and run_before) are encoded in order from the last coefficient to the first coefficient, ordinal references herein to the encoded bitstream and codewords in the encoded bitstream will refer to the coefficients of the zig-zag scan in reverse order. For example, the "first" run_before codeword in the encoded bitstream corresponds to the LAST non-zero coefficient in the scan, while the "next" run_before codeword after the first run_before codeword corresponds to the second-to-last non-zero coefficient in the scan, etc.

Figure 2:
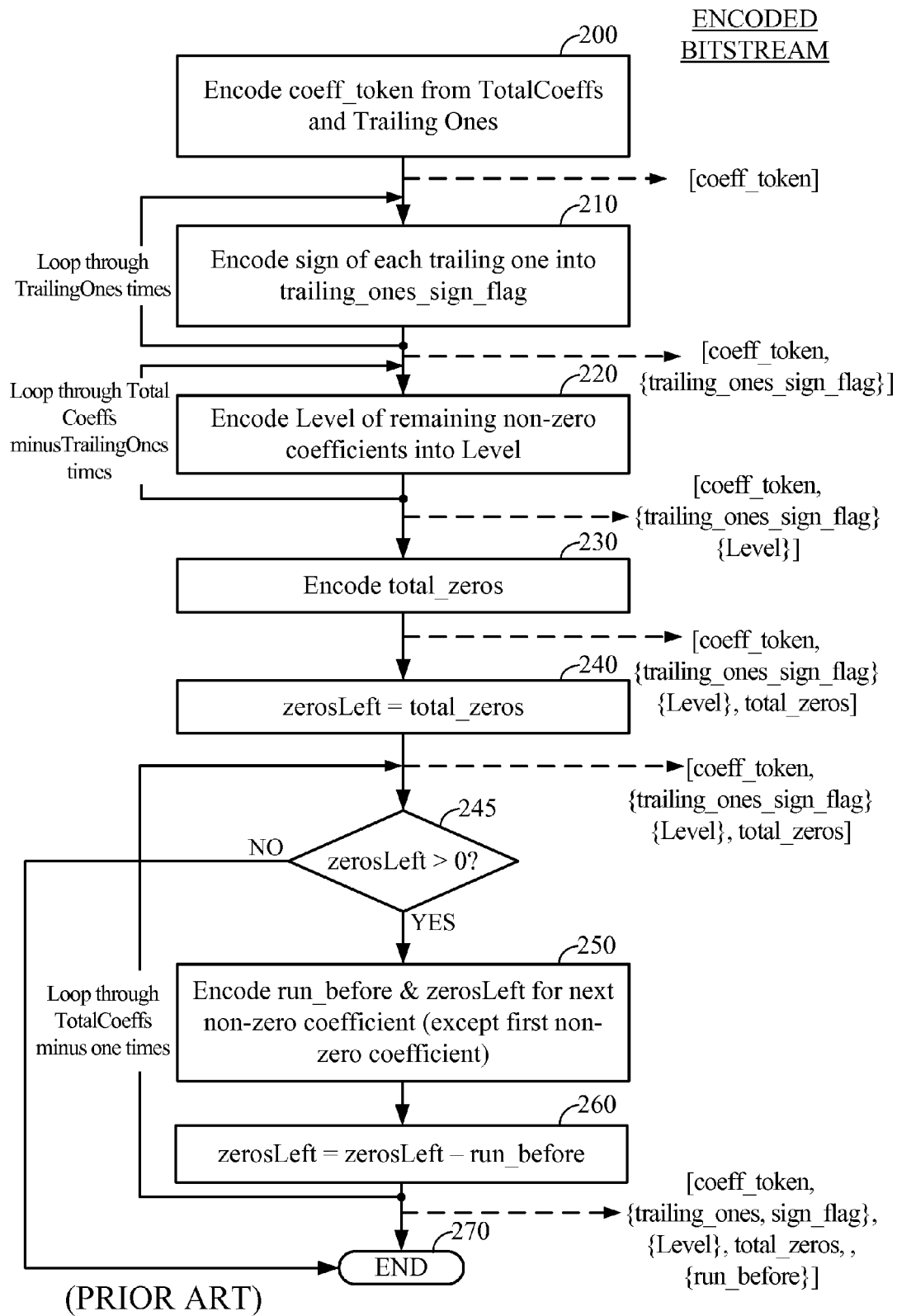
FIG. 2 depicts a prior art method for CAVLC encoding a single coefficient scan.

FIG. 2 depicts a prior art method for CAVLC encoding a single coefficient scan according to the parameters defined above.

In FIG. 2, at step 200, the codeword coeff_token is selected based on the values of TotalCoeffs and TrailingOnes. At the end of step 200, the encoded bitstream is [coeff_token].

At step 210, the sign of each trailing one counted in TrailingOnes is encoded into the field denoted by {trailing_ones_sign_flag}. Step 210 is repeated for each coefficient counted in TrailingOnes. The encoded bitstream is [coeff_token, {trailing_ones_sign_flag}] at the end of step 210, wherein the notation {*} indicates that there may generally be multiple instances of the parameter enclosed in the braces { }, depending on the specific bitstream.

At step 220, the Level of each of the remaining non-zero coefficients not counted in TrailingOnes is encoded. Step 220 is repeated for each remaining non-zero coefficient, i.e., a total of TotalCoeffs minus TrailingOnes number of times. At the end of step 220, the encoded bitstream is [coeff_token, {trailing_ones_sign_flag}, {Level}].

At step 230, the parameter total_zeros is encoded. At the end of step 230, the encoded bitstream is [coeff_taken, {trailing_ones_sign_flag}, {Level}, total_zeros]. Note in an embodiment (not shown), total_zeros need not be encoded if TotalCoeffs is equal to the block size, i.e., there are no zero coefficients.

At step 240, the local parameter zerosLeft is set equal to total_zeros. Note zerosLeft is not encoded into the bitstream, and at the end of step 240, the encoded bitstream is still [coeff_taken, {trailing_ones_sign_flag}, {Level}, total_zeros].

At step 245, the method checks whether zerosLeft is greater than 0. If YES, then the method proceeds to step 250. If NO, then the method terminates at step 270 for the current scan.

At step 250, the parameter run_before for each non-zero coefficient is encoded, based on the corresponding value of zerosLeft.

At step 260, the value of zerosLeft is decremented by the value of run_before just encoded. Steps 250 and 260 are repeated a total of TotalCoeffs minus one number of times, i.e., once for each non-zero coefficient other than the first non-zero coefficient. Note run_before for the first non-zero level coefficient is not encoded, as the decoder may derive the necessary information from the local variable zerosLeft. At the end of step 260, the encoded bitstream is [coeff_taken, {trailing_ones_sign_flag}, {Level}, total_zeros, {run_before}].

At step 270, the method terminates for the current scan, at which point the method may proceed to encode the next scan (not shown).

Note the preceding description of CAVLC encoding has been provided for illustration only, and is not meant to limit the scope of the present disclosure to any particular implementation of a CAVLC encoder.

Figure 3:
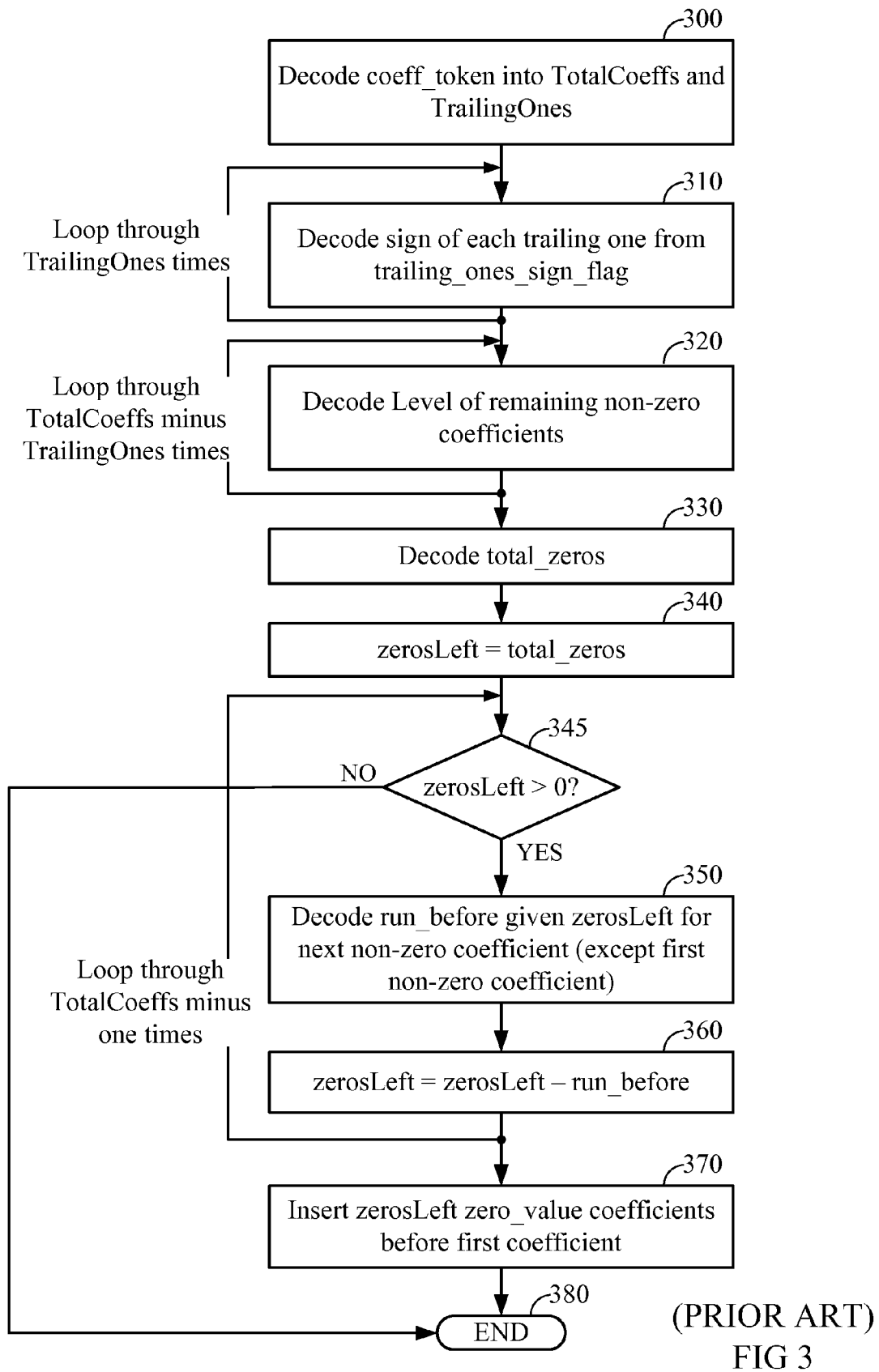
FIG. 3 depicts a prior art method for decoding a CAVLC encoded scan such as described with reference to FIG. 2.

FIG. 3 depicts a prior art method for decoding a CAVLC encoded scan such as described with reference to FIG. 2. Note the prior art method is shown for illustration purposes only, and is not meant to limit the scope of the present disclosure to any particular implementation of a decoder.

In FIG. 3, at step 300, the codeword coeff_taken is first decoded to retrieve the parameters TotalCoeffs and TrailingOnes.

At step 310, the sign of each coefficient counted in TrailingOnes is decoded from the field {trailing_ones_sign_flag}. Step 310 is repeated for each bit in trailing_ones_sign_flag, a total of TrailingOnes number of times.

At step 320, the Level of each of the remaining non-zero coefficients is decoded. Step 320 is repeated for each remaining non-zero coefficient, i.e., TotalCoeffs minus TrailingOnes number of times.

At step 330, the parameter total_zeros is decoded. Note in an embodiment (not shown), total_zeros need not be decoded if TotalCoeffs equals the block size.

At step 340, a local parameter zerosLeft is set equal to total_zeros.

At step 345, the method checks whether zerosLeft is greater than 0. If YES, then the method proceeds to step 350. If NO, then the method terminates for the current scan.

At step 350, the parameter run_before for each non-zero coefficient is decoded based on the received bits of the encoded bitstream and the corresponding value of zerosLeft. At step 360, the value of zerosLeft is decremented by the value of run_before just decoded. Steps 350 and 360 are repeated TotalCoeffs minus one number of times, i.e., once for each non-zero coefficient other than the first non-zero coefficient.

At step 370, zerosLeft zero-value coefficients are inserted before the first non-zero coefficient to recover the original coefficient scan.

At step 380, the method terminates for the current scan, at which point the method may proceed to decode the next scan (not shown).

For the prior art decoding method shown in FIG. 3, it may be noted that at least one iteration through steps 350 and 360 is generally required by the prior art method to decode each run_before codeword associated with a non-zero coefficient. For example, to decode a run_before codeword corresponding to the last non-zero coefficient in the scan, the method executes each of steps 350 and 360 once, and to decode the run_before codeword corresponding to the second-to-last non-zero coefficient in the scan, the method executes each of steps 350 and 360 once again, etc. For some scans, this may lead to a large number of cycles required to decode all the run_before codewords, e.g., when a scan of length N has TotalCoeff equal to (N−1) and total_zeros equal to 1, and the single zero happens to be the first coefficient in the scan. In such a worst-case scenario, at least N−2 iterations through steps 350 and 360 are expended by the prior art decoding method to decode all run_before codewords, even though each run_before codeword decodes to a value of zero.

The present disclosure provides techniques for limiting the number of cycles required to decode a CAVLC encoded scan in such a worst-case scenario. The techniques also offer efficient decoding of any CAVLC encoded scan having consecutive strings of zero-value run_before codewords. Note in this specification and in the claims, a "zero-value run_before codeword" denotes a run_before codeword having a decoded value of zero.

In an embodiment according to the present disclosure, run_before decoding may be accelerated by utilizing specific properties of the run_before codewords adopted in H.264 CAVLC. See Table 9-10 in the H.264 specification, reproduced as FIG. 4 in the accompanying figures. In FIG. 4, it may be noted that regardless of the corresponding value of zerosLeft, the codeword associated with a run_before value of zero always includes a continuous string of ones. Furthermore, only codewords associated with a run_before decoded value of zero are made up of a continuous string of only ones. These codeword properties may be utilized to decode possibly multiple run_before codewords in a single iteration, as further described hereinbelow.

Figure 5:
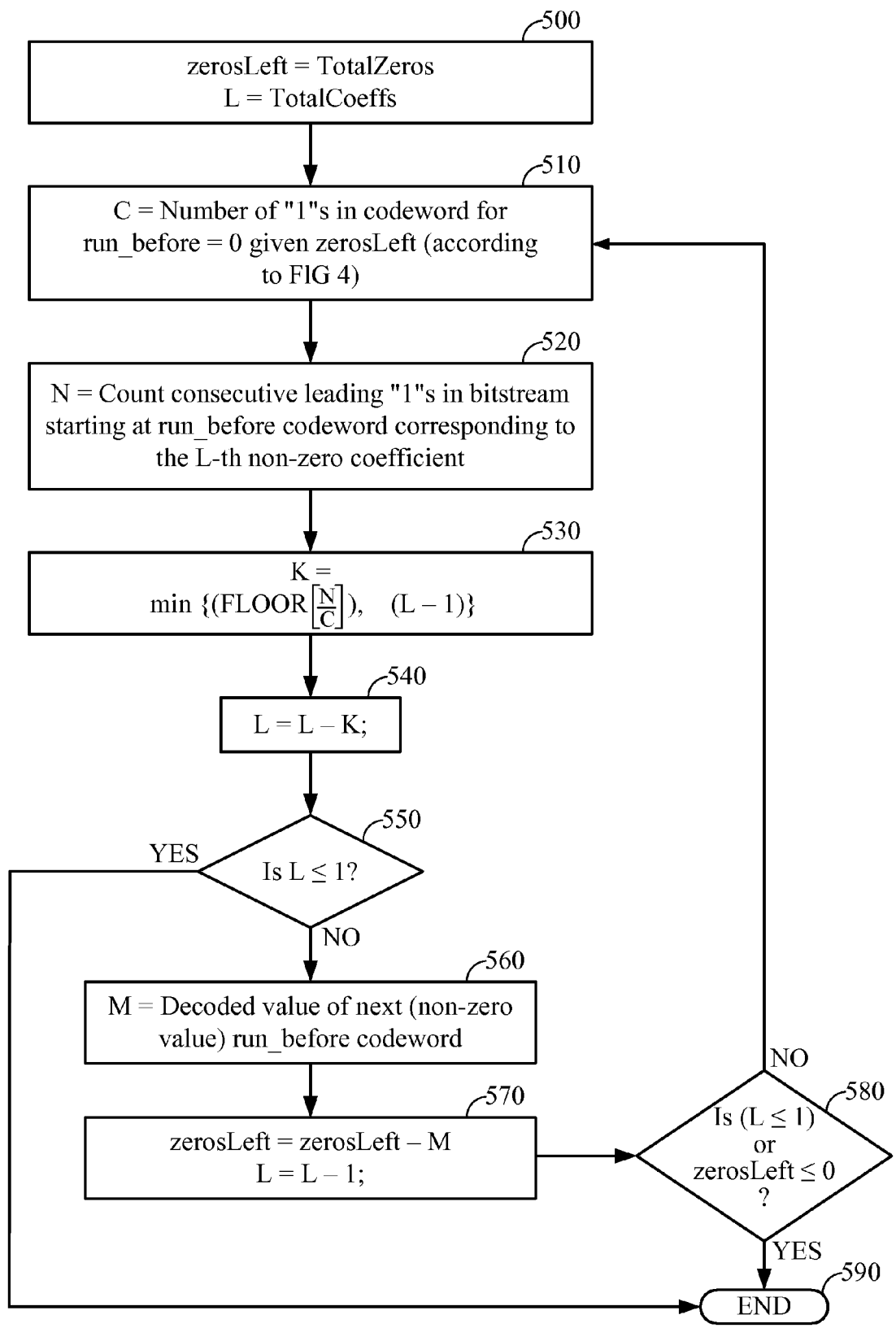
FIG. 5 depicts a method according to the present disclosure for efficiently decoding consecutive zero-value run_before codewords in a bitstream.

FIG. 5 depicts a method according to the present disclosure for efficiently decoding multiple consecutive zero-value run_before codewords. The method depicted may be used, e.g., in place of steps 350 and 360 in the CAVLC decoder of FIG. 3; however, one of ordinary skill in the art will realize that the method depicted may also be used to decode run_before codewords in implementations of a CAVLC decoder other than that shown in FIG. 3. Such embodiments are also contemplated to be within the scope of the present disclosure.

In FIG. 5, at step 500, the local parameter zerosLeft is set to TotalZeros, and an index L is set equal to TotalCoefficients. L represents an index to the non-zero coefficient whose corresponding run_before codeword is to be evaluated in a current iteration of the method.

At step 510, the method counts the number of consecutive 1's in the codeword associated with a run_before value of zero for the current value of zerosLeft, according to the table shown in FIG. 4. The result is assigned to the variable C. For example, according to FIG. 4, if zerosLeft=1, then C=1; if zerosLeft=2, then C=1; if zerosLeft=3, then C=2; etc.

At step 520, the method counts the number of consecutive 1's in the encoded bitstream starting at the position of the run_before codeword corresponding to the L-th non-zero coefficient. The result is assigned to the variable N.

At step 530, the method computes a variable K using the following formula (Equation 1):

$$K=\min\{(\text{floor}[N/C]),(L-1)\};$$

In Equation 1, the term (floor [N/C]) is an indication of the number of consecutive zero-value run_before codewords. The term (L−1) in the minimization function effectively upper bounds the computed value of (floor [N/C]) to (L−1), so that only bits associated with the current scan (as opposed to bits associated with the subsequent scan in the encoded bitstream) are accounted for. One of ordinary skill in the art will appreciate that the value of K thus computed corresponds to the total number of consecutive non-zero coefficients having run_before value of zero in the current scan, starting from the L-th coefficient proceeding towards the first coefficient.

At step 540, the method decrements the coefficient index L to L−K, to account for the K consecutive non-zero coefficients whose corresponding run_before codewords have been processed at step 530.

At step 550, the method checks whether the first non-zero coefficient in the scan has been reached. If YES, then the decoding of the current block is concluded at step 590. If NO, then the method proceeds to step 560.

At step 560, the method decodes the value of the next run_before codeword, whose value is expected to be non-zero. In an embodiment, this may be done using a look-up table, configured using the information depicted in FIG. 4.

At step 570, the method decrements the value of zerosLeft by the decoded run_before value. The method also decrements L by 1 to account for the non-zero coefficient whose corresponding run_before codeword has been decoded at step 560.

At step 580, the method checks for whether the end of the bitstream corresponding to the current scan has been reached. If YES, then the decoding of the run_before codewords of the current scan is concluded at step 590. If NO, then the method returns to step 510.

One of ordinary skill in the art will realize that the method depicted in FIG. 5 processes a string of consecutive 1's, corresponding to possibly a plurality of zero-value run_before codewords, using a single computational step (step 530). Thus the embodiment shown requires only one iteration through steps 510 through 570 to decode the run-before codewords associated with the previously described worst-case scenario, i.e., wherein a scan of length N has TotalCoeff equal to (N−1) and total_zeros equal to 1, and the single zero happens to be the first coefficient in the scan.

One of ordinary skill in the art will also appreciate that the above-described embodiment may be readily modified to accommodate alternative encoding schemes (e.g., other than that shown in FIG. 4) wherein zero-value run_before codewords contain consecutive strings of "0's" rather than "1's." Such embodiments are also contemplated to be within the scope of the present disclosure.

Figure 6:
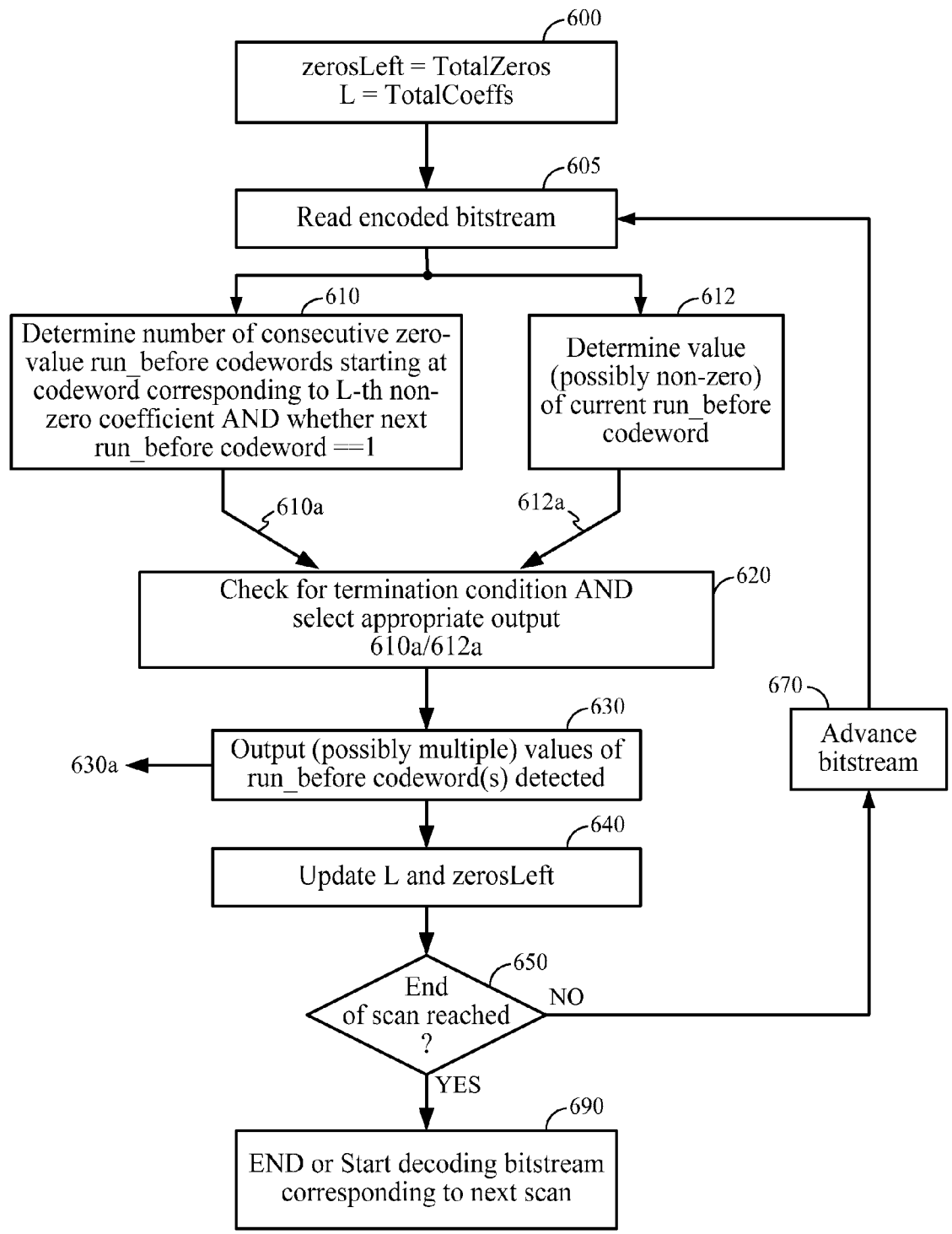
FIG. 6 depicts an alternative decoding method of the present disclosure featuring a look-up table-based decoder for run_before decoding.

FIG. 6 depicts an alternative embodiment of the present disclosure for run_before decoding. The method depicted may be used, e.g., in place of steps 350 and 360 in the CAVLC decoder of FIG. 3. One of ordinary skill in the art will nevertheless realize that the decoding method depicted may be used to decode run_before codewords in any implementation of a CAVLC decoder, and any such embodiments are contemplated to be within the scope of the present disclosure.

In FIG. 6, at step 600, the local parameter zerosLeft is set to TotalZeros, and the index L is set equal to TotalCoeffs.

At step 605, the method reads the encoded bitstream.

After step 605, the method performs two steps 610 and 612 in parallel on the bitstream read at step 605.

At step 610, the method determines whether any consecutive zero-value run_before codewords are present at the start of the bitstream, and if so, the number of such zero-value codewords present. Step 610 additionally determines whether a non-zero run_before codeword immediately following the consecutive zero-value run_before codewords has a value of one. In an embodiment, step 610 may be implemented using one or more look-up tables, as described further hereinbelow with reference to FIGS. 7A-7C and 8A-8B.

At step 612, the method determines the value of a run_before codeword associated with a current coefficient, which may be a non-zero coefficient. In an embodiment, step 612 may be implemented using a look-up table, as described further hereinbelow with reference to FIGS. 9A-9C.

At step 620, the method checks for a termination condition of the current scan, and also selects the appropriate signal from among the results 610a and 612a of steps 610 and 612 described above. One of ordinary skill in the art will appreciate that the selected signal from the results 610a and 612a may be further modified depending on the status of the termination condition checking. For example, if the termination condition checking determines that some portion of the bits decoded from the sampled segment 605a corresponds to the next scan rather than to the current scan, then the method may extract only the information corresponding to the current scan from the selected signal. Such operations for extracting only information corresponding to the current scan will be clear in light of the present disclosure with reference to FIG. 5.

In an embodiment, step 620 may limit the number of detected codewords in the result 610a to up to L−1 codewords.

At step 630, the method outputs a signal 630a that includes the (possibly multiple) decoded values of the run_before codewords detected. For example, if the result 610a of step 610 is selected at step 620, and a series of 3 zero-value run_before codewords are detected followed by a run_before codeword of value 1, then the output signal 630a may include the decoded run_before values [0, 0, 0, 1].

At step 640, the parameters L and zerosLeft are updated based on the run_before codewords detected.

At step 650, the method checks whether the end of the scan has been reached. If YES, then the method terminates at step 690. If NO, then the method proceeds to step 670, wherein the bitstream is advanced, and the method returns to step 605. In an embodiment, a bitstream sampling counter is incremented by the number of bits corresponding to the run_before codewords already detected and decoded.

FIGS. 7A-7C depict an embodiment of a look-up table, LUT1, for implementing the operations described with reference to step 610 in FIG. 6. Note that FIGS. 7A-7C are provided for illustration only, and are not meant to limit the scope of the present disclosure to any particular implementation of the operations described with reference to step 610.

In FIG. 7A, LUT1 is shown for a scenario wherein the bitstream to be decoded has values zerosLeft=1 and block size=16. An entry in the column entitled "INPUT: Bitstream" is decoded to the corresponding value in the columns entitled "OUTPUT: # of zero-value run-before codewords" and "OUTPUT: Next run_before==1?" The notation ["1"×α, "0"] denotes a string of α ones followed by a zero in the bitstream. For example, the bitstream ["1"×13, "0"] denotes thirteen ones followed by a zero in a bitstream, and is decoded using LUT1 in FIG. 7A as 13 consecutive non-zero coefficients having zero-value run_before, followed by a non-zero run_before codeword having a value of one.

FIG. 7B depicts an example implementation of LUT1 for zerosLeft=2 and block size=16. Note according to FIG. 4, the zero-value run_before codeword is "1" when zerosLeft=2, while the run_before codeword having a value of one is "01." For example, the bitstream ["1"×13, "01"] is decoded using LUT1 in FIG. 7B as 13 consecutive non-zero coefficients having zero-value run_before, followed by a non-zero run_before codeword having value one. Conversely, a bitstream such as ["1"×13, "00"] is decoded using LUT1 as 13 consecutive zero-value run_before codewords, followed by an indication that the next non-zero run_before codeword does NOT have a value of one.

FIG. 7C depicts the corresponding example implementation of LUT2 for zerosLeft=3 and block size=16.

Given the examples shown in FIGS. 7A, 7B, and 7C, one of ordinary skill in the art may readily derive the implementations of LUT1 for the values of zerosLeft not shown, e.g., zerosLeft >3.

Note the example implementations of LUT1 are given for illustration only. One of ordinary skill in the art will appreciate that the same functionality may be achieved using alternative designs of look-up tables and/or logic. For example, in an alternative embodiment, the input to the look-up table may be the output of a logic block that counts the number of consecutive ones at the start of a sampled segment of the bitstream, and simply outputs the number of consecutive ones to LUT1. The input entries for LUT1 would then correspond to a list of possible numbers of consecutive ones counted. Such embodiments are contemplated to be within the scope of the present disclosure.

FIGS. 8A-8B depict an alternative embodiment for achieving the same functionality as provided by LUT1 in FIG. 7B for ZerosLeft=2 and Block Size=16. One of ordinary skill in the art may readily apply the principles disclosed to design look-up tables for alternative values of ZerosLeft and Block Size.

In FIG. 8A, a first look-up table LUT1.STRING determines the number of consecutive initial zero-value run_before codewords present in an input bitstream. In FIG. 8B, a second look-up table LUT1.LKAHEAD determines whether a run_before codeword following the initial string of consecutive zero-value run_before codewords has a value of 1. The outputs of the two look-up tables LUT1.STRING and LUT1.LKAHEAD are combined to indicate both: 1) the number of consecutive zero-value run_before codewords present, and 2) whether the next run_before codeword has a value of 1.

The look-up table design depicted in FIGS. 8A-8B may be advantageous in that it reduces the number of entries needed to perform the required functionality of step 610, compared to an LUT design such as that illustrated in FIGS. 7A-7C. In particular, the implementation of LUT1.STRING necessarily incorporates logic for detecting whether a next bit or bits in a bitstream is NOT a particular value, as illustrated in FIG. 8A. This avoids the need to positively enumerate all such possibilities, and may result in substantial savings in the number of LUT entries required for large values of ZerosLeft.

One of ordinary skill in the art will appreciate that the operations performed by look-up tables such as those depicted in FIGS. 7A-7C and FIGS. 8A-8B allow the method to determine both of the following parameters in a single table look-up cycle: 1) the number of consecutive initial zero-value run_before codewords, and 2) whether a non-zero run_before codeword immediately following any initial consecutive zero-value run_before codewords has a value of one. Thus the number of cycles required to handle the previously mentioned worst-case scenario may be less than that required by a decoding implementation wherein, e.g., each run_before codeword is independently decoded, regardless of the codeword's value.

According to the present disclosure, the run_before decoding at step 610 of FIG. 6 need not be limited to decoding in one table look-up whether the next run_before codeword has a value of 1. For example, in an alternative embodiment, a single operation could be designed to determine the following three parameters: 1) the number of consecutive initial zero-value run_before codewords, 2) whether a non-zero run_before codeword immediately following any consecutive initial zero-value run_before codewords has a value of one, and 3) whether that same non-zero-value run_before codeword has a value of 2. Corresponding modifications to the look-up table and subsequent logic to support such an implementation, as well as implementations covering one-cycle decoding of run_before codewords having even greater decoded value than 2, are readily derivable by one of ordinary skill in the art, and are contemplated to be within the scope of the present disclosure.

FIGS. 9A-9C depict an embodiment of a look-up table, LUT2, for implementing the operations described with reference to step 612 in FIG. 6. In FIGS. 9A, 9B, and 9C, the look-up tables are shown for zerosLeft=1, 2, and 3, respectively. An entry in the column entitled "INPUT: Bitstream" is decoded to the corresponding entry in the column entitled "OUTPUT: Decoded run_before codeword." In the figures, the designation ["1" - - - ] denotes a bitstream having a first bit with value one, followed by an arbitrary set of bits.

One of ordinary skill in the art will realize that by modifying the look-up tables, the embodiment of FIG. 6 can readily accommodate the decoding of run_before codewords utilizing encoding schemes other than that depicted in FIG. 4. For example, the table in FIG. 4 may specify an encoding scheme wherein zero-value run-before codewords do not consist merely of consecutive one's, but any arbitrary string of bits. For the embodiments shown in FIGS. 7-9, the appropriate modifications will consist of merely modifying the corresponding input and output entries of the LUT's. Such embodiments are contemplated to be within the scope of the present disclosure.

Based on the teachings described herein, it should be apparent that an aspect disclosed herein may be implemented independently of any other aspects and that two or more of these aspects may be combined in various ways. Aspects of the techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A method for decoding at least one run_before codeword in an encoded bitstream of a current coefficient scan, the method comprising:
    identifying, with a decoding apparatus, a bit sequence in the encoded bitstream corresponding to a number of consecutive zero-value run_before codewords;
    checking, with the decoding apparatus, a termination condition of the encoded bitstream; and
    based on the identified bit sequence and the checking of the termination condition, identifying, with the decoding apparatus, the number of consecutive zero-value run_before codewords corresponding to the current coefficient scan.

2. The method of claim 1, the identifying the bit sequence comprising counting a number N of consecutive ones in the encoded bitstream.

3. The method of claim 2, the identifying the number of consecutive zero-value run_before codewords comprising dividing N by a variable C, wherein C corresponds to the number of consecutive ones in a zero-value run_before codeword.

4. The method of claim 3, the identifying the number of consecutive zero-value run_before codewords further comprising taking a floor of the quotient of N and C.

5. The method of claim 4, the identifying the number of consecutive zero-value run_before codewords further comprising taking the minimum of said floor and the total number of remaining run_before codewords expected for the current coefficient scan.

6. The method of claim 1, further comprising decoding a next run_before codeword after the identified consecutive zero-value run_before codewords, if the termination condition of the bitstream is not met.

7. The method of claim 1, the method further comprising identifying whether a next run_before codeword after the identified bit sequence corresponding to the number of consecutive zero-value run_before codewords has a value of 1.

8. The method of claim 7, the method further comprising identifying whether the next run_before codeword has a value of 2.

9. The method of claim 7, the method further comprising decoding the bit sequence in the encoded bitstream corresponding to a non-zero-value run_before codeword.

10. The method of claim 7, further comprising performing in parallel the identifying the bit sequence in the encoded bitstream corresponding to the number of consecutive zero-value run_before codewords, the identifying whether the next run_before codeword after the identified bit sequence corresponding to a number of consecutive zero-value run_before codewords has a value of 1, and the decoding the bit sequence in the encoded bitstream corresponding to the non-zero-value run_before codeword.

11. The method of claim 10, the identifying the number of consecutive zero-value run_before codewords comprising selecting one of the results of the operations performed in parallel, the method further comprising modifying the selected result based on the checking of the termination condition.

12. The method of claim 1, the identifying the bit sequence in the encoded bitstream comprising inputting the bit sequence into a first look-up table.

13. The method of claim 7, the identifying the bit sequence in the encoded bitstream and the identifying whether a next run_before codeword has a value of 1 comprising inputting the bit sequence into a second look-up table.

14. The method of claim 7, the identifying the bit sequence in the encoded bitstream and the identifying whether the next run_before codeword has a value of 1 comprising:
   inputting the bit sequence into a first look-up table configured to indicate whether a run_before codeword following a consecutive string of zero run_before codewords has a value of 1;
   inputting the bit sequence into a second look-up table configured to indicate the number of consecutive string of zero run_before codewords in the bit sequence; and
   combining the outputs of the first and second look-up tables.

15. The method of claim 9, the decoding the bit sequence in the encoded bitstream corresponding to the non-zero-value run_before codeword comprising inputting the bit sequence into a third look-up table.

16. The method of claim 10, the method further comprising outputting at least one value of the run_before codeword detected in the encoded bitstream.

17. An apparatus for decoding at least one run_before codeword in an encoded bitstream of a current coefficient scan, the apparatus comprising:
   a bit sequence identifier for identifying a sequence of bits in the encoded bitstream corresponding to a number of consecutive zero-value run_before codewords;
   a termination condition checker for checking a termination condition of the encoded bitstream; and
   a run_before decoder for identifying the number of consecutive zero-value run_before codewords corresponding to the current coefficient scan based on the identified bit sequence and the checked termination condition.

18. The apparatus of claim 17, the bit sequence identifier comprising a counter for counting a number N of consecutive ones in the encoded bitstream.

19. The apparatus of claim 18, the run_before decoder comprising a divider for dividing N by a variable C, wherein C corresponds to the number of consecutive ones in the zero-value run_before codeword.

20. The apparatus of claim 19, the run_before decoder further comprising a floor module for taking a floor of the quotient of N and C.

21. The apparatus of claim 20, the run_before decoder further comprising a comparator for comparing the floor of said quotient and the total number of remaining run_before codewords expected for the current coefficient scan, and choosing the minimum.

22. The apparatus of claim 17, the apparatus further comprising a next run_before decoder for identifying the next run_before codeword after the identified consecutive zero-value run_before codewords, if the termination condition of the bitstream is not met.

23. The apparatus of claim 17, the apparatus further comprising a next run_before decoder for identifying whether a next run_before codeword after the identified bit sequence corresponding to a number of consecutive zero-value run_before codewords has a value of 1.

24. The apparatus of claim 23, the decoder and the next run_before decoder comprising:
   a first look-up table configured to indicate whether a run_before codeword following a consecutive string of zero run_before codewords has a value of 1; and
   a second look-up table configured to indicate the number of consecutive string of zero run_before codewords in the bit sequence.

25. The apparatus of claim 23, the next run_before decoder further identifying whether the next run_before codeword after the identified bit sequence corresponding to the number of consecutive zero-value run_before codewords has a value of 2.

26. The apparatus of claim 23, the apparatus further comprising a decoder for decoding the bit sequence in the encoded bitstream corresponding to the non-zero-value run_before codeword.

27. The apparatus of claim 23, the next run_before decoder and the run_before decoder simultaneously performing decoding.

28. The apparatus of claim 17, the bit sequence identifier comprising a look-up table.

29. The apparatus of claim 17, the run_before decoder comprising a look-up table.

30. The apparatus of claim 23, the next run_before decoder comprising a look-up table.

31. The apparatus of claim 27, the run_before decoder outputting at least one value of a run_before codeword detected in the encoded bitstream.

32. An apparatus for decoding at least one run_before codeword in an encoded bitstream of a current coefficient scan, the apparatus comprising:
   means for identifying a bit sequence in the encoded bitstream corresponding to a number of consecutive zero-value run_before codewords;
   means for checking a termination condition of the encoded bitstream; and
   means for, based on the identified bit sequence and the checking of the termination condition, identifying a number of consecutive zero-value run_before codewords corresponding to the current coefficient scan.

33. A computer-readable storage medium comprising instructions for causing one or more processors to decode at least one run_before codeword in an encoded bitstream of a current coefficient scan, wherein the instructions to decode the at least one run_before codeword comprise instructions to cause the one or more processors to:
   identify a bit sequence in the encoded bitstream corresponding to a number of consecutive zero-value run_before codewords;
   check a termination condition of the encoded bitstream; and
   based on the identified bit sequence and the checking of the termination condition, identify a number of consecutive zero-value run_before codewords corresponding to the current coefficient scan.

* * * * *